United States Patent
Yi et al.

(10) Patent No.: US 9,793,185 B2
(45) Date of Patent: Oct. 17, 2017

(54) TEST STRUCTURE FOR MONITORING LINER OXIDATION

(71) Applicant: GLOBALFOUNDRIES Singapore Pte. Ltd., Singapore (SG)

(72) Inventors: Wanbing Yi, Singapore (SG); Daxiang Wang, Singapore (SG); Juan Boon Tan, Singapore (SG); Kemao Lin, Singapore (SG); Shaoqiang Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 324 days.

(21) Appl. No.: 14/538,811

(22) Filed: Nov. 12, 2014

(65) Prior Publication Data

US 2016/0133531 A1    May 12, 2016

(51) Int. Cl.
| | |
|---|---|
| G01R 31/20 | (2006.01) |
| H01L 21/66 | (2006.01) |
| H01L 23/00 | (2006.01) |
| H01L 49/02 | (2006.01) |

(52) U.S. Cl.
CPC .......... *H01L 22/34* (2013.01); *H01L 24/10* (2013.01); *H01L 28/20* (2013.01); *H01L 2924/01029* (2013.01); *H01L 2924/01074* (2013.01)

(58) Field of Classification Search
CPC .......... G01R 31/26; G01R 31/2642; G01R 31/2648; G01R 31/2831; G01R 31/31702
See application file for complete search history.

(56) References Cited

U.S. PATENT DOCUMENTS

| 6,603,162 B1 * | 8/2003 | Uchiyama ............. G03F 9/7076 |
| | | 257/296 |
| 2015/0042978 A1 * | 2/2015 | Lynch ....................... H01L 22/12 |
| | | 356/36 |

OTHER PUBLICATIONS

K. Miyamoto et al., Impact of Pattern Density on Plasma Damage of CMOS LSIs, IEEE, 1996, pp. 739-742.
Kai-Min Yin et al., Oxidation of Ta diffusion barrier layer for Cu metallization in thermal annealing, Thin Solid Films 388, 2001, pp. 27-33, Elsevier Science B.V.
Andrew H. Simon et al., Effect of TaN Stoichiometry on Barrier Oxidation and Defect Density in 32nm Cu/Ultra-Low K Interconnects, MRS Proceedings, 2010, vol. 1249, Materials Research Society 2010.

* cited by examiner

*Primary Examiner* — Tung X Nguyen
(74) *Attorney, Agent, or Firm* — Horizon IP Pte. Ltd.

(57) ABSTRACT

Embodiments of a method for forming a device using test structures are presented. The method includes providing a wafer with a device layer. The device layer includes a main device region and a perimeter region. The device layer is patterned with active and test patterns. Test patterns include dummy patterns disposed in a test device area. The wafer is processed to form at least one test device disposed in the perimeter region and one or more active devices disposed in the main device region. The test device determines a design window of the one or more active devices. Additional processing is performed to complete forming the device.

21 Claims, 9 Drawing Sheets

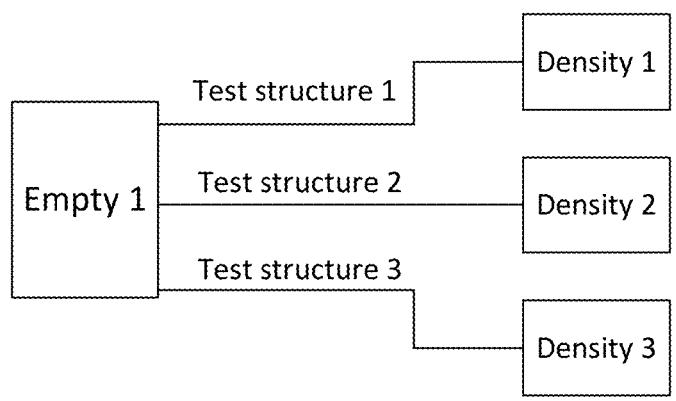
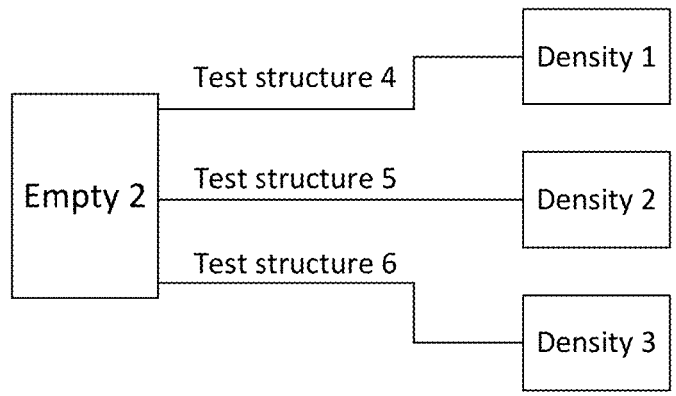
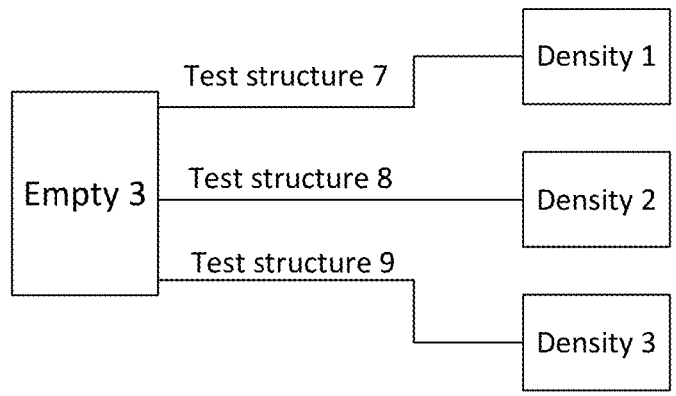
800
Fig. 8

TEST STRUCTURE FOR MONITORING LINER OXIDATION

BACKGROUND

Integrated circuit (IC) devices generally include an interlayer dielectric (ILD) formed over the wafer substrate. The ILD is subsequently patterned to form metal-filled recessed features, such as contacts and interconnects. For example, conductive metals with low resistivity and high electromigration resistance form the features and define the performance of the contact and interconnect structures. Some conductive metals may undesirably diffuse into the dielectric material surrounding the recessed features and negatively impact the dielectric properties. Therefore, a diffusion barrier layer is typically deposited between the dielectric and conductive metal to prevent migration of conductive metals. However, barrier faults may be introduced during the deposition process of the barrier layer, resulting in premature failure of the IC.

From the foregoing discussion, it is desirable to provide improved methods for forming the barrier layers and maintaining barrier integrity.

SUMMARY

Embodiments generally relate to a semiconductor device and a method of forming a semiconductor device. In one embodiment, a method of forming a device includes providing a wafer with a device layer. The device layer includes a main device region and a perimeter region. The device layer is patterned with active and test patterns. Test patterns include dummy patterns disposed in a test device area. The wafer is processed to form at least one test device disposed in the perimeter region and one or more active devices disposed in the main device region. The test device determines a design window of the one or more active devices. Additional processing is performed to complete forming the device.

In another embodiment, a method of forming a device includes providing a substrate with a device layer and a resist layer is formed on the device layer. The method includes providing a patterned reticle having active and test patterns corresponding to active and test devices. The test device determines a design window of the active device. Active patterns are disposed in a device region and the test patterns are disposed in a frame region surrounding the device region. The test patterns include a filled region filled with dummy structures, the filled region surrounds an empty region devoid of dummy structures, and the empty region surrounds an innermost region having a resistor. The resist layer is patterned using the reticle to form a patterned resist layer containing active and test patterns of the reticle. An etch is performed to pattern the device layer using the patterned resist layer and additional processing is performed to complete forming the device.

In yet another embodiment, a device is presented. The device includes a wafer having active patterns disposed on a wafer substrate. The active patterns are defined by a design window which is determined by a test structure. The test structure includes a filled region filled with dummy structures, the filled region surrounds an empty region devoid of dummy structures, and the empty region surrounds an innermost region having a resistor with designed resistance. A pairing of the empty region and filled region determines the designed window.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 8 shows exemplary pairings for different sized empty regions and different densities of filled regions.

DETAILED DESCRIPTION

Embodiments generally relate to devices, for example, semiconductor devices or integrated circuits (ICs). More particularly, embodiments relate to dummy patterns in ICs. The ICs can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

Figure 1:
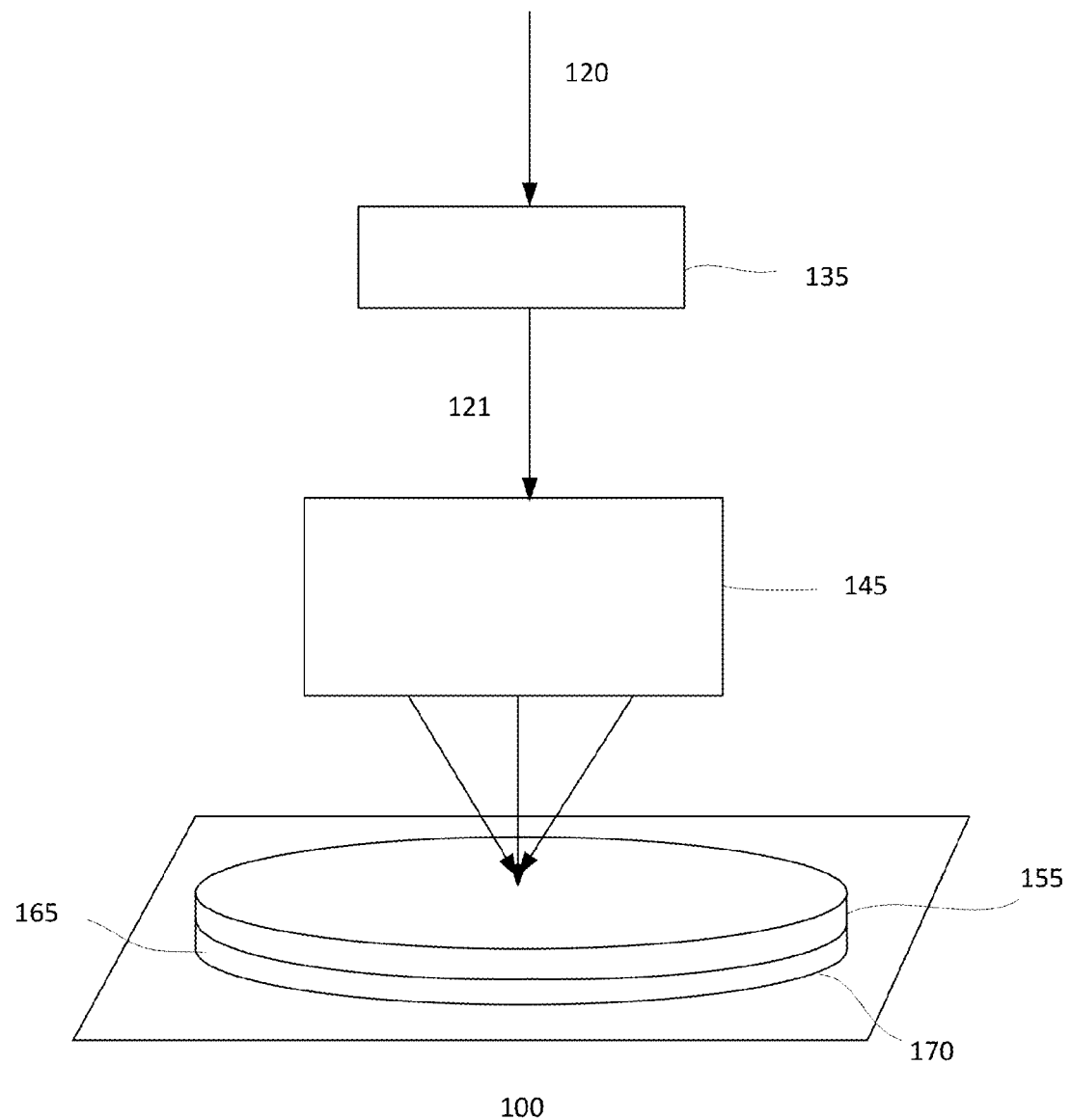
FIG. 1 shows a simplified diagram of a portion of an exemplary lithographic system.

FIG. 1 shows a simplified portion of an exemplary photolithography system 100 used for patterning a wafer to form features, such as circuit components. The photolithography system may include, for example, exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam). The EMR operating beam is passed through the illumination sub-system. The illumination sub-system, for example, may include mirrors and/or lenses. The illumination sub-system conducts the EMR operating beam 120 to a mask or reticle 135 having a desired pattern (e.g., mask pattern).

In one embodiment, the reticle is a transmissive reticle. For example, the reticle transmits the EMR operating beam through it. The transmitted EMR beam 121 is a patterned beam having the pattern of the reticle. Other suitable types of reticles, such as reflective reticles, can also be employed.

For example, the reflective reticle reflects the EMR operating beam, creating a reflected patterned beam.

The patterned beam is projected onto the wafer 165. In one embodiment, the wafer is disposed on a translation stage 170. In one embodiment, the patterned beam is projected onto the wafer by a projection sub-system 145. The projection sub-system may include mirrors and/or lenses for projecting the patterned beam onto a portion of the wafer. The wafer includes a photoresist layer 155 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic or printing systems may also be useful.

After the wafer has been exposed, the photoresist is developed, transferring the pattern of the reticle to the resist layer. An anti-reflective coating (ARC) may be provided beneath the resist layer to improve lithographic resolution. The patterned resist layer serves as an etch mask. For example, an anisotropic etch, such as an RIE, patterns the wafer using the etch mask. Depending on the stage of process, the etch may etch a bare wafer, a layer on the wafer, or multiple layers on the wafer. In the fabrication of an IC, numerous patterning processes utilizing different reticles may be performed.

After processing of the wafer is completed, the wafer is diced along the dicing channel (or kerf) to produce individual dies or ICs. The dies are packaged to form chips. In some embodiments, wafer level packaging may be performed prior to dicing the wafer. Other configurations of packaging the ICs may also be useful.

Figure 2:
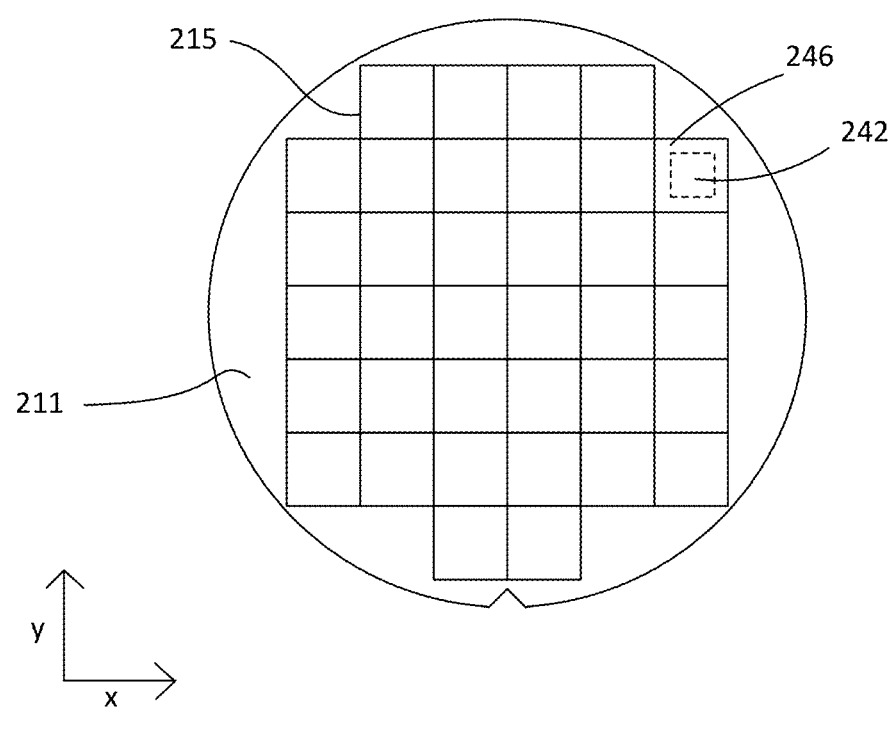
FIG. 2 shows a simplified plan view of a semiconductor wafer.

FIG. 2 shows a simplified plan view of a semiconductor wafer 165. The semiconductor wafer, for example, may be a silicon wafer. Other types of wafers are also useful. For example, the wafer may be a p-type, n-type, silicon-on-insulator (SOI) or silicon germanium wafer.

The wafer includes an active surface 211 on which a plurality of devices 215 are formed. The plurality of devices may be formed on the wafer in parallel. The devices, for example, are arranged in rows along a first (x) direction and columns along a second (y) direction. A device, as shown, includes a main device region 242 and a perimeter region 246. The main device region includes features and interconnections of the device. As for the perimeter region, it surrounds the main device region. The perimeter region, for example, serves as dicing channels on the wafer, separating adjacent devices. The devices are singulated by dicing the wafer along the dicing channels.

In one embodiment, the wafer includes test devices. The test devices are, for example, disposed in the perimeter regions of the devices. For example, the test devices are formed in the dicing channels on the wafer. Forming the test devices in other regions, such as the main device regions, may also be useful. In one embodiment, the test devices are dedicated test structures designed to monitor pattern dependent electrical communication between device features. Other applications of the test structures may also be useful. Other types of test devices may also be useful.

Figure 3:
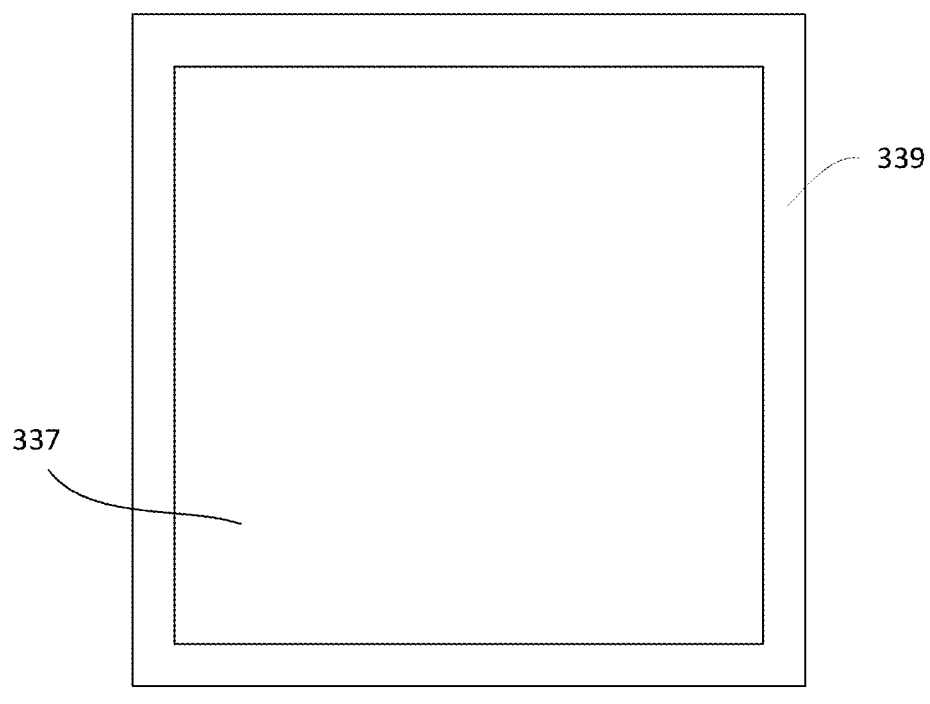
FIG. 3 shows a simplified plan view of an embodiment of a reticle used in exposing a wafer.

FIG. 3 shows an embodiment of a reticle 135 used in exposing a wafer. As shown, the reticle includes a prime or main region 337. The main region, for example, may be referred to as the device region. The device region includes a pattern which, for example, corresponds to the pattern to be formed in the device. The device region creates patterns of devices in the main device regions on the wafer. A frame region 339 surrounds the device region. In one embodiment, the frame region includes one or more patterns which, for example, correspond to patterns to form one or more test devices on the wafer. The frame region, for example, corresponds to perimeter regions or dicing channels on the wafer. The frame region surrounds the devices on the wafer. The reticle is used to create desired patterns for respective levels on the device. The desired patterns may be defined by, for example, a design window. In one embodiment, the design window determines local pattern density of the desired patterns. The design window is determined by test devices formed on the wafer. For example, test structures disposed in the perimeter regions of the wafer may be employed to design or identify the design for manufacturing (DFM) process window for forming a device. For example, the test structures are used to determine local pattern density of the desired patterns. In forming the device, numerous reticles may be employed.

Figure 4A:
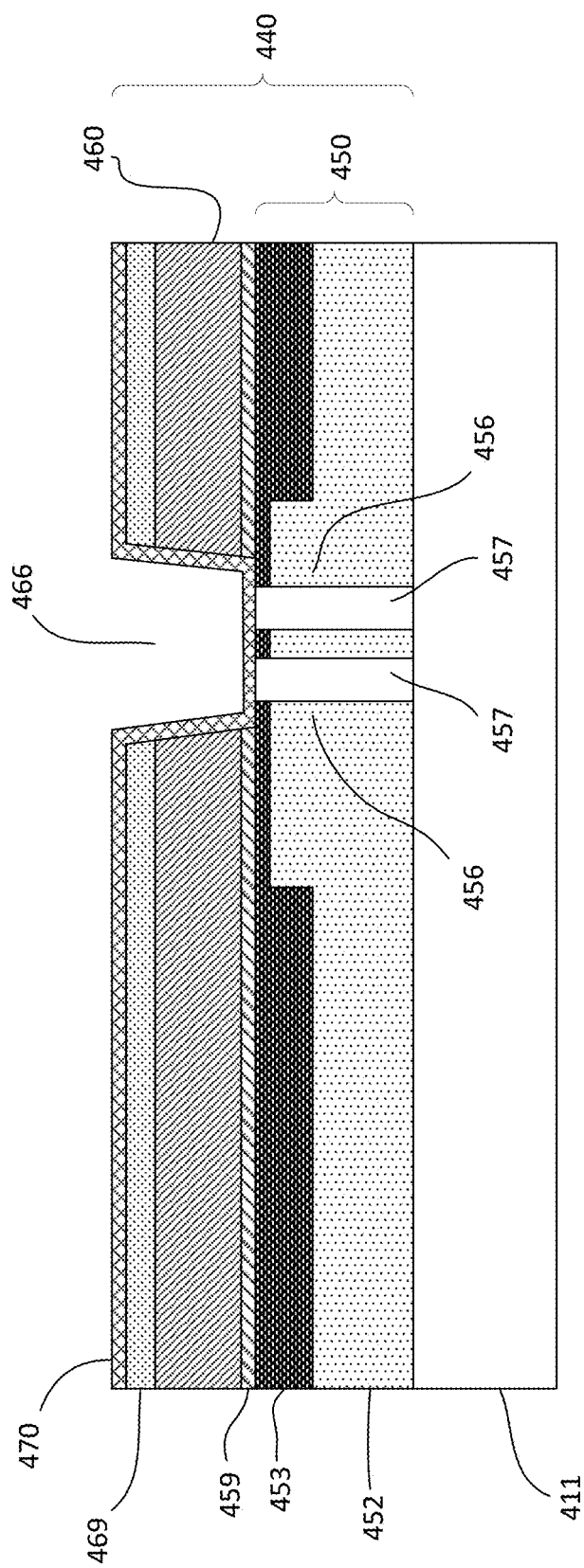
FIGS. 4a-4b show cross-sectional views of a process for forming an embodiment of a device.
Figure 4B:
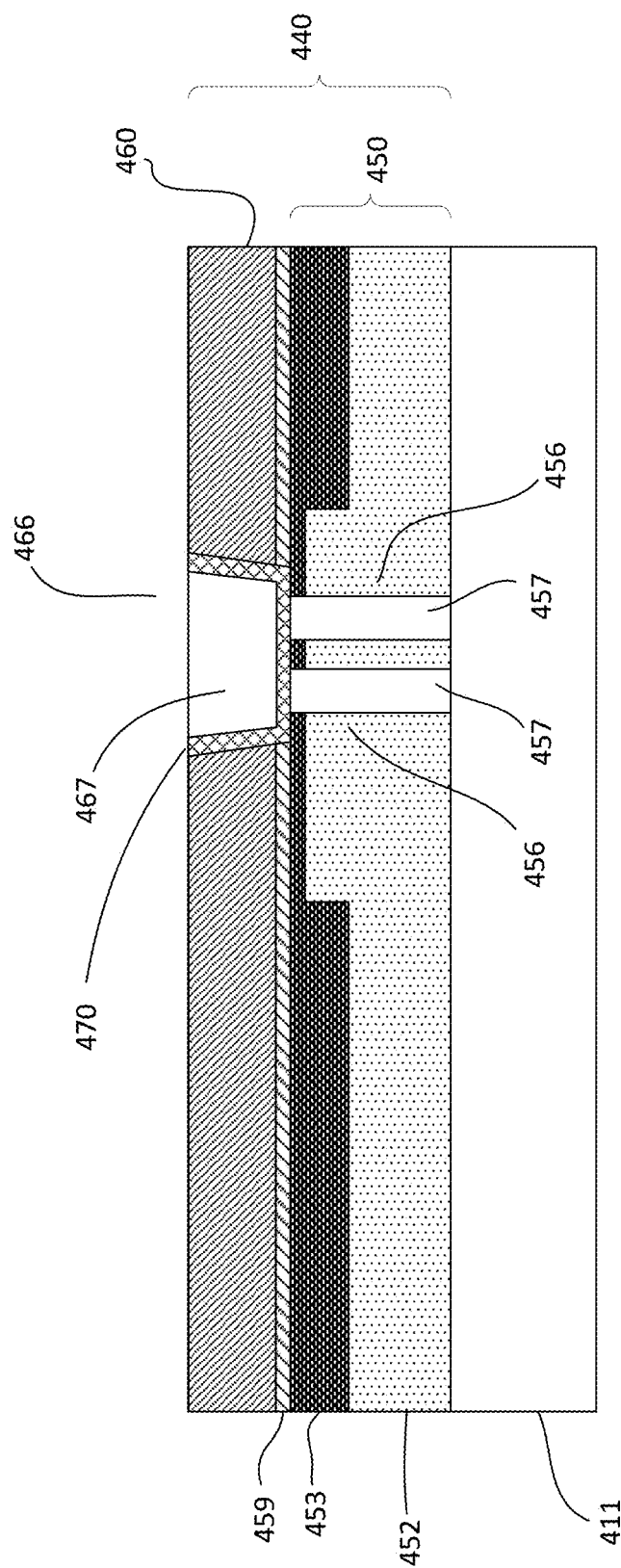

FIGS. 4*a*-4*b* show simplified cross-sectional views of a process for forming an embodiment of a device 400. In particular, a simplified portion of a wafer is shown. For example, the portion of the wafer illustrates a simplified portion of a device of a plurality of devices on the wafer. The wafer is, for example, similar to that described in FIG. 2. The wafer includes front end of line (FEOL) processing. FEOL processing includes, for example, forming transistors on the wafer.

Referring to FIG. 4*a*, the device includes a substrate 411. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be the same material.

An interlayer dielectric (ILD) layer 440 is disposed on the substrate to serve as a metal level. In one embodiment, the ILD layer includes upper and lower ILD layers, such as a metal level dielectric layer 460 and a contact level dielectric layer 450 respectively. The metal and contact levels may be formed of one or more dielectric layers. For example, the ILD may be composed of one or more dielectric layers, such as silicon oxide, low k dielectrics, high k dielectrics, other suitable types of dielectrics or a combination thereof. In some cases, one or more etch stop layers may be provided between the metal and contact levels. Interconnect or interconnect lines are formed in the metal level dielectric layer and contacts are formed in the contact level dielectric layer. For example conductive interconnects and contacts are formed in dielectric materials of the metal and contact levels. Various conductive materials, such as copper, tungsten, aluminum or alloys thereof, may be used to form the interconnects and contacts. The interconnects and contacts can be formed of the same material or different materials. For example, in the case of dual damascene processes, the interconnects and contacts are formed of the same material. For single damascene processes, the interconnects and contacts can be formed of different materials. Other configurations of interconnects and contacts may also be useful.

As shown, the ILD layer corresponds to the first ILD level. For example, the contact level dielectric (CA) layer is a pre-metal dielectric (PMD) layer and the interconnect level dielectric layer is a first metal level (M1). Other metal or ILD levels may also be useful. Contacts 457 are formed in vias 456 in the contact level dielectric layer. The contacts may be in communication with contact regions, such as gates and source/drain (S/D) regions of transistors. Other types of contact regions may also be useful. The contacts at the PMD level may be tungsten contacts. Other types of contacts may also be useful.

In one embodiment, the contact level dielectric layer includes first and second contact level dielectric layers 452 and 453. The first contact level dielectric layer, for example is a high aspect ratio process (HARP) dielectric layer while the second contact level dielectric layer is a tetraethyl orthosilicate (TEOS) layer. The TEOS layer may be formed by, for example, chemical vapor deposition (CVD). As shown, the HARP layer is non-planar. For example, the HARP layer includes topography from front-end-of-line (FEOL) processing, such as forming gates. The as deposited TEOS layer includes topography of the underlying HARP layer. A planarization process, such as chemical mechanical polishing (CMP), may be performed on the TEOS layer to provide a planar top surface. Other techniques for forming or configurations of the contact level dielectric layer may also be useful.

Contacts 457 may be disposed in via openings in the contact level dielectric layer. For example, via openings may be formed by patterning the contact level dielectric layer using an anisotropic etch, such as a reactive ion etch (RIE). The etch may employ an etch mask, such as a photoresist mask with openings corresponding to the via openings. Other types of etch mask may also be useful. The mask is removed after forming the via openings. A conductive material, such as tungsten, is deposited on the wafer, filling the via openings. Excess conductive material is removed by, for example, chemical mechanical polishing (CMP), forming contacts having a top surface coplanar with the top of the contact level dielectric layer. Other techniques for forming contacts may also be useful.

An etch stop layer 459 is deposited on the contact level dielectric layer. The etch stop layer for example, may be a nitride barrier for low k (nBLOK) diffusion barrier layer. Other types of etch stop layers, such as low k nBLOK or silicon nitride, may also be useful. The metal level dielectric layer is deposited on the etch stop layer. In one embodiment, the metal level dielectric layer is a low k dielectric layer. For example, the metal level dielectric layer may be a porous dielectric layer, such as a dielectric layer having at least Si, C, O and H (SICOH). Other types of dielectric layers may also be useful. A hard mask 469, such as a TEOS hard mask, may be provided over the metal level dielectric layer. The hard mask may serve as part of the metal level dielectric layer. For example, the hard mask is disposed over a low k dielectric layer. The hard mask, which is denser than the low k material, provides improved surface uniformity after a planarization process, such as CMP. The metal level dielectric and hard mask layers may be formed by CVD. Other techniques for forming or configurations of the metal level dielectric layer may also be useful.

A trench 466 is formed in the metal level dielectric layer. The trench, for example, is formed by an anisotropic etch, such as RIE using a resist mask (not shown). The etch forms a trench opening in the metal level dielectric layer. For example, the hard mask and metal level dielectric layer are etched to form the trench opening. The resist mask may be removed after forming the trench opening. Other techniques for patterning the metal level dielectric may also be useful. The trench, as shown, corresponds to a metal interconnect in communication with the contacts. The etch to form the trench should be sufficient to expose the contacts. For example, an over-etch may be performed, ensuring that the etch stop layer is completely removed to expose the top of the contacts.

After the trench is formed, a barrier liner 470 is formed on the wafer, lining the trench and metal level dielectric layer. For example, the barrier liner lines the trench and hard mask. The barrier liner serves as a barrier, for example, against diffusion of components of the ILD and subsequently formed metal or interconnect line, such as a copper line, in the trench. In one embodiment, the barrier liner is a conductive barrier layer. In one embodiment, the conductive barrier layer includes a combination of conductive materials, such as tantalum nitride (TaN) and tantalum (Ta). Other types of conductive barrier layers may also be useful. The conductive barrier layer, in one embodiment, is formed by sputtering. Other techniques for forming the barrier layer may also be useful.

In a preferred embodiment, the trench is etched sufficiently deep to expose the contacts without exposing the HARP layer. For example, the duration of the over-etch is modulated to expose the top of the contacts without exposing the HARP layer. By not exposing the HARP layer, oxidation of barrier liner is reduced. For example, protecting the HARP layer prevents oxygen radical from $CO_2$ plasma from causing the HARP interface to be oxygen-rich.

Referring to FIG. 4b, the process continues to form the interconnect 467 in the trench. In one embodiment, a conductive material is formed on the wafer, filling the trench opening and covering the barrier liner. The conductive material, for example, may be copper or copper alloy. The conductive material may be formed by plating techniques. Electro-chemical or electroless plating may be employed to form the conductive material. Excess conductive material may be removed by, for example, a planarizing process. For example, a polishing process may be employed to remove excess conductive material. In one embodiment, the polishing process removes the hard mask, providing a planar top surface. The polishing process may also remove some of the low k dielectric layer below. For example, an over-polish may be employed, removing the hard mask and a small amount of the underlying low k layer. The polishing process produces a coplanar top surface with the interconnect 467 in the trench and metal level dielectric layer 460. The polishing process, for example, includes CMP. Other planarizing or polishing processes, including electro-CMP (eCMP), may also be useful.

Although, the simplified cross-sectional views show only one interconnect in communication with two contacts side-by-side, other configurations may also be useful. Furthermore, an interconnect may include other contacts. It is also understood that a device may include numerous interconnects and contacts. Additionally, the device may include additional metal levels. For example, additional metal levels may be formed by dual damascene techniques, forming multiple interconnects and contacts using the same material. The process may continue to complete the device and/or the plurality of devices on the wafer, including forming passivation layers, dicing, packaging and testing. Other processes or combination of processes may be performed to complete the devices.

Figure 5:
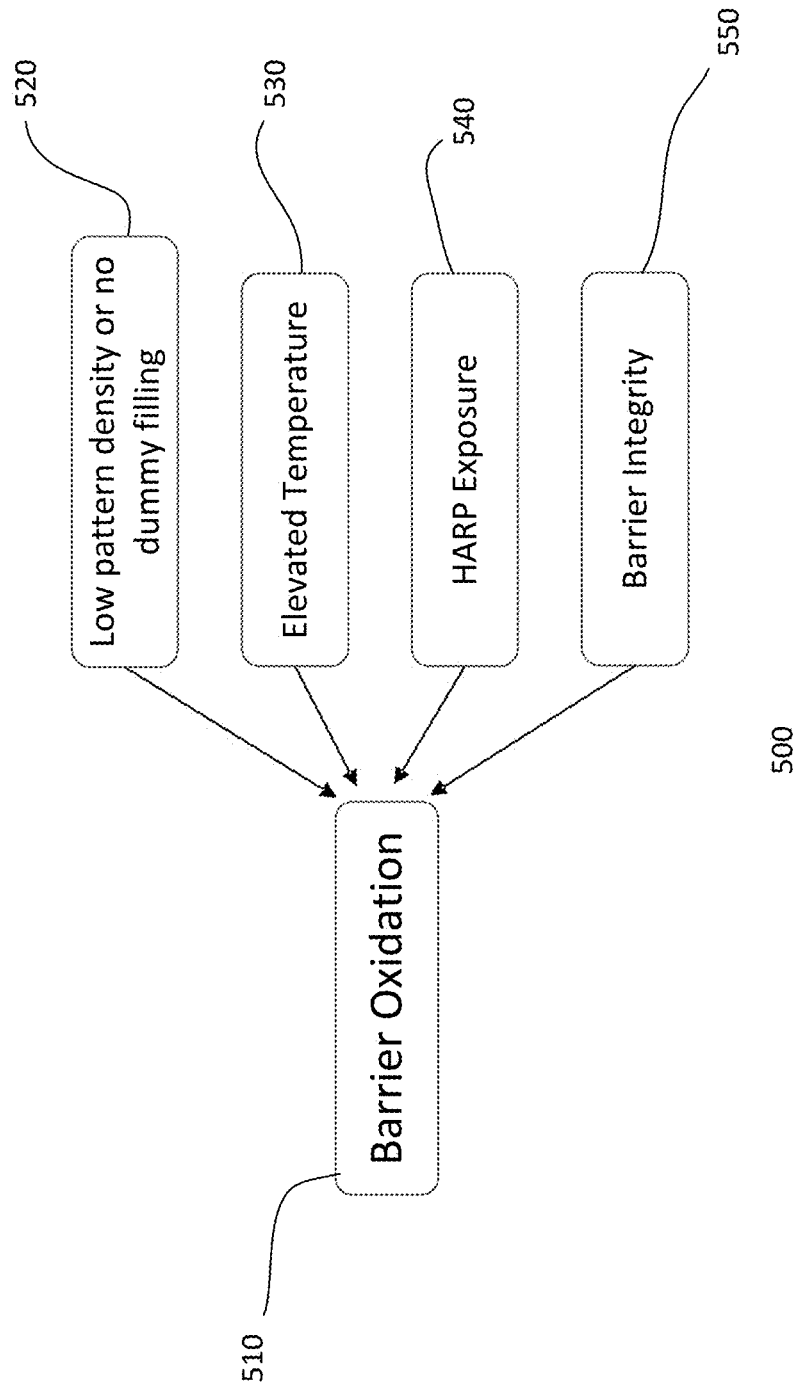
FIG. 5 shows a simplified diagram of various exemplary failure mechanisms related to barrier oxidation in an exemplary device.

We have observed that oxidation of barrier liner contributes to failures in interconnects. As such, we conducted investigations into causes of barrier oxidation. FIG. 5 shows various exemplary failure mechanisms 500 which were identified as contributing to barrier oxidation 510. For example, four mechanisms 520, 530, 540 and 550 were identified as contributing to barrier oxidation. As shown, low pattern density, elevated temperature, HARP exposure, and barrier integrity were identified as contributors of barrier oxidation.

With respect to pattern density, experiments were conducted on a test wafer. The experiments include providing dummy patterns in the first metal level or M1. The dummy patterns, for example, are rectangular shaped patterns filled with conductive material of the metal level, such as copper. Providing other types of dummy patterns may also be useful. For example, the dummy patterns may also include other shapes and conductive materials. Different dummy pattern densities were tested. The pattern densities tested range from 10% to 70%. The experiments indicated that there is a strong correlation between pattern density and barrier oxidation failures. For example, yield loss of up to 91% were observed when no dummy patterns were used. However, barrier oxidation failures were reduced with increased dummy pattern density. Yields were significantly improved when dummy patterns were added. It is believed that increased yields are due to effective plasma density being higher at isolated structures than with denser structures. For example, the effective plasma density of etch processes at isolated structures increases barrier oxidation failures.

Integrity of the barrier layer also contributes to barrier oxidation. The integrity of the barrier layer may be affected by the deposition process. The barrier layer is sputter deposited to line the bottom and sidewalls of the trench as well as the top of the upper ILD layer. For example, the TaN layer is sputter-deposited to line the bottom and sidewalls of the trench as well as the top of the upper ILD layer. The sputtering process may include a strong etch back component to improve sidewall coverage. However, the strong etch back component reduces horizontal portions of the barrier layer. For example, a strong etch back component reduces the thickness of the barrier layer at the bottom of the trench. This creates a rough interface between CA and M1. A thinner TaN layer is found to reduce barrier integrity and contribute to oxidation of the barrier.

As for elevated temperature, it relates to high temperature processes, such as the final alloy step. Higher temperatures provide more energy for oxidation to occur. For example, oxidation is more likely to occur under the high temperatures during the final alloy process. Temperatures in the final alloy step, for example, may reach up to 400° C.

Exposure of the HARP layer also contributes to barrier oxidation. For example, the HARP layer may be exposed during RIE to form the trench in M1. This can occur if the RIE etches the metal level too deep, exposing the HARP layer. For example, the RIE penetrates through the TEOS layer and exposes the underlying HARP layer. In some embodiments, to prevent exposure of the HARP layer during trench formation, the thickness of the TEOS layer may be increased. Other suitable measures to prevent exposure of the HARP layer may also be useful. For example, the effective etch plasma density may also be reduced by increasing pattern density to reduce or prevent over-etching of the metal level.

As discussed, various causes may affect barrier oxidation. The causes may be design or process related, or a combination thereof. For example, design related causes include metal level pattern density, such as M1 pattern density. Process related causes include, for example, process temperature, etching of the trench and deposition of the barrier liner, including composition of the barrier liner.

In one embodiment, a test structure is provided. The test structure is employed to determine a design for manufacturing (DFM) process window. The test structure, for example, enables determination of the process window for forming contacts and interconnects in ILD layers. In one embodiment, the test structure enables determination of the process window for forming contacts and interconnects in CA and M1. The test structure is employed to characterize the interface between CA and M1. For example, a high resistance between CA and M1 may indicate barrier oxidation. The test structure may also be used to monitor barrier interface of other interconnect levels or layers.

Figure 6:
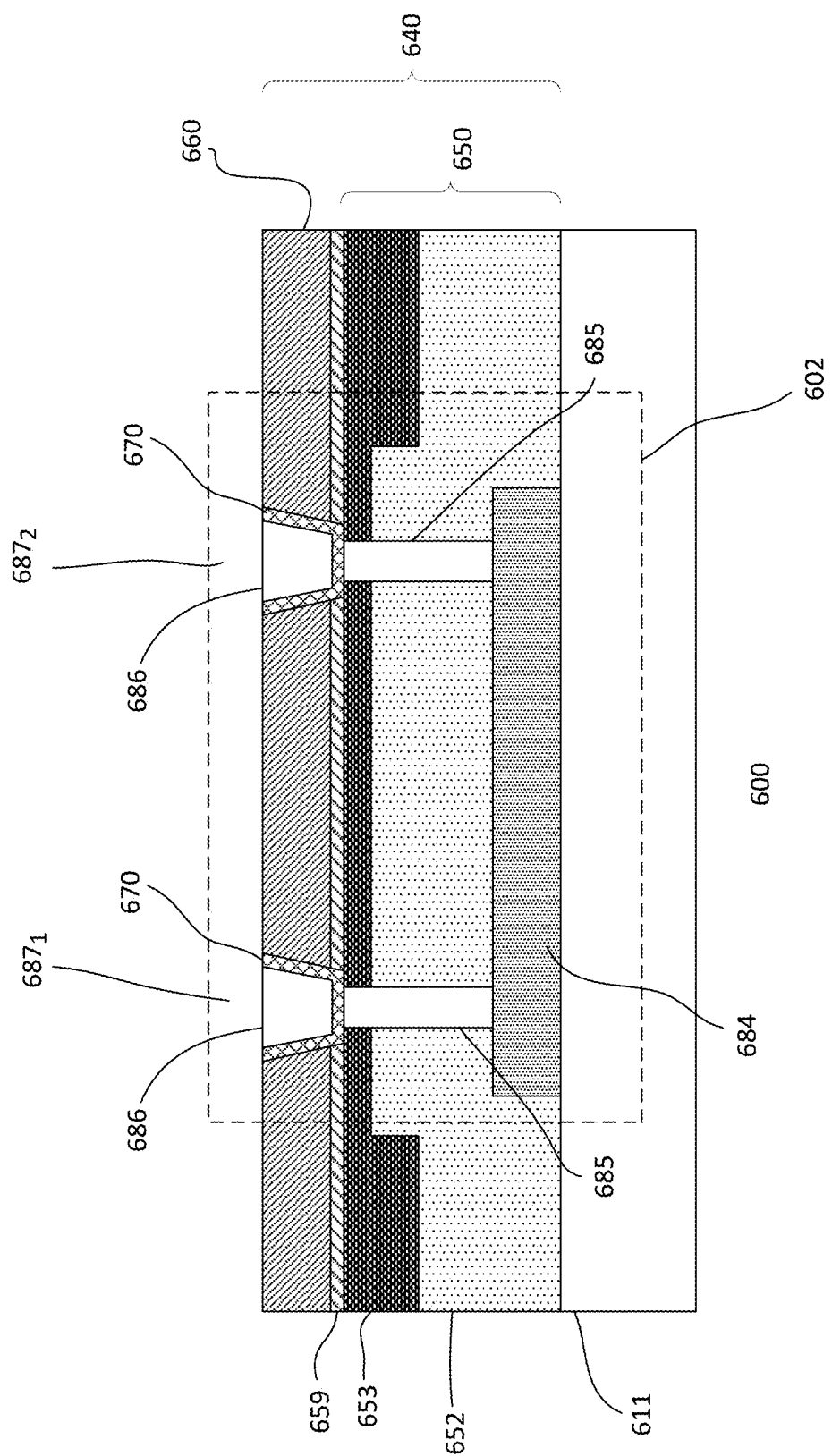
FIG. 6 shows a cross-sectional view of an embodiment of a device.

FIG. 6 shows a simplified cross-sectional view of an embodiment of a device 600. The device, as shown, may include similar elements as the device shown in FIGS. 4a-4b. Common elements may not be described or described in detail. The device includes a substrate 611, such as a silicon wafer. Other types of substrates may also be useful.

A simplified portion of a wafer is shown. For example, the portion of the wafer illustrates a simplified portion of a device of a plurality of devices on the wafer. The wafer is, for example, similar to that described in FIG. 2. The wafer includes front end of line (FEOL) processing. FEOL processing includes, for example, forming transistors on the wafer.

An ILD layer 640 is disposed on the substrate to serve as a metal level. In one embodiment, the ILD layer includes upper and lower ILD layers, such as a metal level dielectric layer 660 and a contact level dielectric layer 650 respectively. The metal and contact levels may be formed of one or more dielectric layers. For example, the ILD may be composed of one or more dielectric layers, such as silicon oxide, low k dielectrics, high k dielectrics, other suitable types of dielectrics or a combination thereof. In some cases, one or more etch stop layers may be provided between the metal and contact levels. Interconnect or interconnect lines are formed in the metal level dielectric layer and contacts are formed in the contact level dielectric layer. For example conductive interconnects and contacts are formed in dielectric materials of the metal and contact levels. Various conductive materials, such as copper, tungsten, aluminum or alloys thereof, may be used to form the interconnects and contacts. The interconnects and contacts can be formed of the same material or different materials. For example, in the case of dual damascene processes, the interconnects and contacts are formed of the same material. For single damascene processes, the interconnects and contacts can be formed of different materials. Other configurations of interconnects and contacts may also be useful.

In one embodiment, the ILD layer corresponds to the first metal level (M1). For example, the contact level (CA) dielectric layer is a pre-metal dielectric (PMD) and the interconnect or metal level dielectric layer is M1. Contacts are formed in vias in the contact level dielectric layer. The contacts may be in communication with contact regions, such as gates and source/drain (S/D) regions of transistors. Other types of contact regions may also be useful. The contacts at the PMD level may be tungsten contacts. Other types of contacts may also be useful.

In one embodiment, the contact level dielectric layer includes first and second contact level dielectric layers 652 and 653. The first contact level dielectric layer, for example is a high aspect ratio process (HARP) dielectric layer while the second contact level dielectric layer is a TEOS layer. The TEOS layer may be formed by, for example, chemical vapor deposition (CVD). A planarization process, such as chemical mechanical polishing (CMP), may be performed to provide a planar top surface. Other techniques for forming or configurations of the contact level dielectric layer may also be useful.

The metal level dielectric layer, in one embodiment, is a low k dielectric layer. For example, the metal level dielectric layer may be a porous dielectric layer, such as SICOH. Other types of dielectric layers may also be useful. An etch stop layer 659 is disposed between the upper and lower ILD layers. The etch stop layer for example, may be nBLOK. Other types of etch stop layers may also be useful. Other configurations of ILD layers may also be useful.

In one embodiment, a test structure 602 is disposed on the substrate and in the ILD layer. In one embodiment, the test structure is disposed on the substrate as well as in the contact level and first metal level (M1) of the device. The test structure may be disposed in the perimeter region of a device. For example, the test structure is formed along the dicing channels of the wafer. Although the portion of the device shows one test structure, it is understood the device may include numerous test structures.

The test structure includes a resistor formed on a substrate. The resistor 684 includes a resistive element with first and second resistor ends. The resistive element, in one embodiment, is a polysilicon resistive element. The polysilicon resistive element may be similar to a gate. For example, the resistive element includes a polysilicon gate electrode over a gate dielectric. The use of a polysilicon resistive element makes the test structure compatible to existing logic processes. Other types of resistive elements may also be useful. The resistive element may be an elongated member. For example, the resistive element may have a rectangular shape. Other shapes may also be useful.

First and second resistor terminals 687$_1$ and 687$_2$ are disposed on the ILD layer in communication with the resistor 684 for measuring its resistance. For example, the first terminal 687$_1$ is in communication with about a first end of the resistor while the second terminal 687$_2$ is in communication with about a second end of the resistor. A terminal includes a lower terminal 685 in the lower ILD layer and an upper terminal 686 in the upper ILD layer. For example, the lower terminal is a contact disposed in a via in the lower ILD or contact level while the upper terminal is a metal pad formed in a trench opening in the upper ILD or metal level. Similar to metal or interconnect lines, the trench in which the metal pad is disposed is lined with a barrier layer 670. The lower terminal may include tungsten, the upper terminal may include copper and the barrier layer may include a combination of conductive materials, such as TaN and Ta. For example, the materials of the lower and upper terminals may be the same as those used in the CA and M1 levels.

The resistive element is designed with a designed resistance ($R_D$). The resistance $R_D$ may depend on, for example, material used, including doping concentration, surface area or size of the resistive element, as well as the distance between the resistor terminals. In one embodiment, $R_D$ is the designed total electrical resistance between the first and second resistor terminals. Measuring a resistance of the test structure may indicate whether the barrier liner has been oxidized. For example, a final or measured resistance ($R_F$) of the test structure is compared to $R_D$. A $R_F$ which exceeds a threshold resistance ($R_T$) may indicate oxidation of the barrier layer or liner. The value of $R_T$ may be set at about 30% higher than $R_D$. Providing other $R_T$ values greater than $R_D$ may also be useful.

Figure 7:
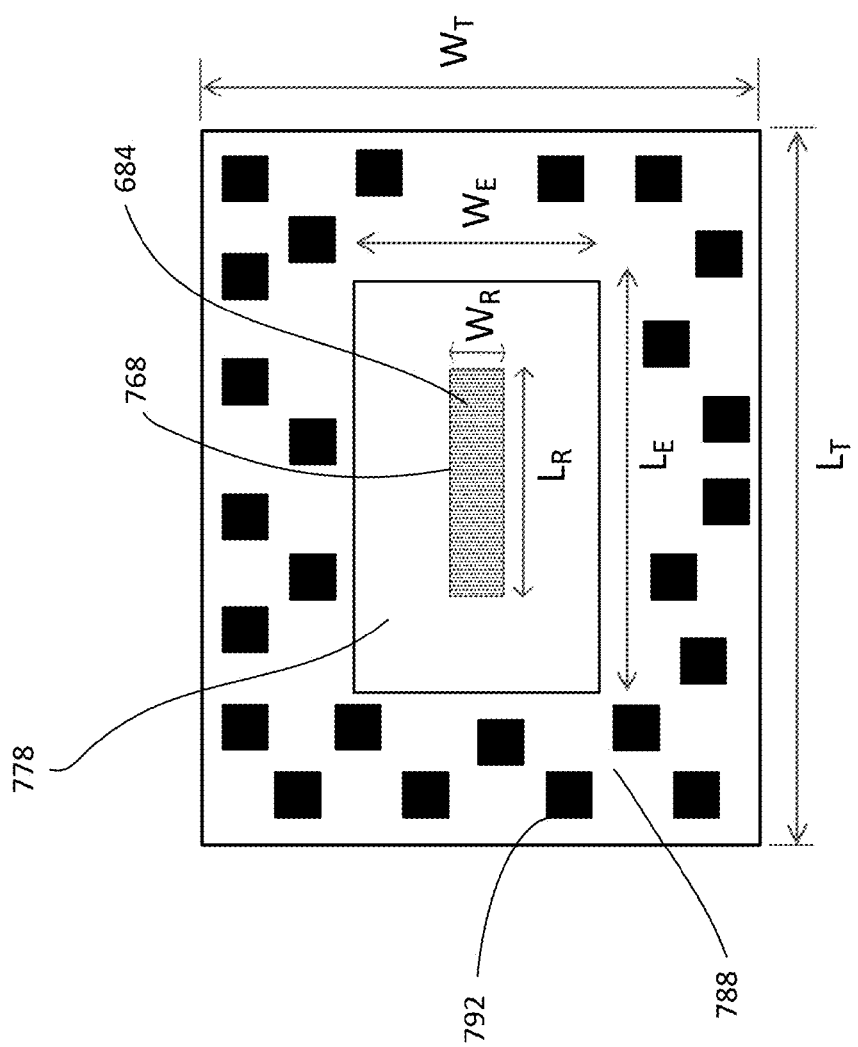
FIG. 7 shows a top view of an exemplary layout of a test structure.

FIG. 7 shows a simplified top view of an embodiment of a test structure 700. The test structure includes a resistor 684 disposed in a test structure area. The resistor, for example, is similar to that described in FIG. 6. Common elements may not be described or described in detail. As shown, the test structure area includes first, second and third regions 768, 778 and 788. For example, the first region is the innermost region, the second or intermediate region surrounds the first region and the third or outermost region surrounds the second region. In one embodiment, the various regions are concentric regions. Other configurations of the test structure may also be useful. For example, the regions need not be concentric.

The first or innermost region serves as a resistor region. For example, the resistor 684 is disposed in the resistor region. The resistor region includes the resistive element, such as the gate structure, on the substrate. The first region has a length $L_R$ and a width $W_R$. The dimensions of the first region may be defined by the resistive element. For example, the size or dimension of the resistive element defines the dimensions of the first region. First and second resistor terminals are provided and coupled to the resistive element, forming the resistor. A resistor terminal includes a contact in the contact or CA level and a conductive terminal in the trench or M1 level. The contact is coupled to the resistive element. As for the conductive terminal, it is coupled to the contact and lined with a barrier layer, such as TaN. The conductive terminal may be a metal pad formed in a trench and lined with a barrier layer. The conductive terminals may be coupled to conductive lines or pads in an upper metal level, such as second metal level (M2). Other configurations of conductive terminals and resistors may also be useful.

As for the second or intermediate region surrounding the resistor region, it is an empty region. For example, the empty region is devoid of dummy structures. For example, the empty region includes only the dielectric material of the ILD layer. The empty region, for example, reflects a region with isolated features. The second region has a length $L_E$ and a width $W_E$.

The third region, in one embodiment, is filled with dummy structures 792 in the trench level. The third region has a length $L_T$ and a width $W_T$. For example, the third region defines the total dimension of the test structure. In one embodiment, $W_T$ does not exceed the width of the scribe line or dicing channel. Having a width dimension, which does not exceed the width of the scribe line dimension, enables the test structure to be disposed in the frame region of the reticle or outside of the active device region. This produces a test structure in the dicing region of the wafer. The scribe line width is, for example, about 60-80 μm. Providing other dimensions may also be useful. For example, the scribe line dimension depends on the technology node and dicing process. In the case where $W_T$ is greater than the scribe line, the test structure may be disposed in the active device region. For example, the test structure is provided in a test device of a test wafer or in a production device of a production wafer.

In one embodiment, the third region is a filled region filled with dummy structures in the M1 level. The dummy structures, for example, are rectangular shaped structures formed of the conductive material of the metal level, such as copper. Other shapes for the dummy structures may also be useful. Although same-size square dummy structures are illustrated, it is to be understood that the dummy structures may be different sized and shaped dummy structures. The third region may be provided with dummy structures having a density P. For example, the third region is uniformly distributed with dummy interconnect structures having a pattern density P.

The process of forming the test structure may be similar to that described in forming the device of FIGS. 4a-4b. For example, the various layers and features may be formed as described in FIGS. 4a-4b. A reticle, similar to that described in FIG. 3, may include patterns related to the features of the test structure.

The device may be provided with a plurality of test structures. The test structures may be designed with different sized empty regions and filled regions with different dummy densities. For example, different sizes may be defined for the empty region and different densities may be defined for the filled region. The different sizes of the empty regions are different and comply with the following rules:

$$W_R \leq W_E \leq W_T;$$

and $$L_R \leq L_E \leq L_T.$$

The different densities of the filled regions are different and comply with the following rule:

$$0 \leq P \leq 100\%.$$

Preferably $10 \leq P \leq 70\%$. Providing other pattern densities for the filled regions may also be useful.

Pairings are formed between the different sizes of the empty regions and the different densities of the filled regions. Each pairing, for example, forms a test structure. For example, in the case of m number of different sizes of empty regions and n number of different densities of filled regions, there are m×n different test structures. The different test structures have different dimensions and densities that comply with the above rules. For example, the different test structures have different $W_E$, $L_E$ and P that comply with the above rules. Preferably, the value of m×n is less than 50. Other values of m and n may also be useful. For example, having the value of m×n to be about 50 may also be useful. The value of m×n may depend on the desired granularity and/or stepping of the area and density.

FIG. 8 illustrates the pairings for different sized empty regions and different densities of filled regions. As illustrated, there are 3 different sized empty regions, empty 1, empty 2 and empty 3 and 3 different densities of filled regions, density 1, density 2 and density 3. For example m=3 and n=3. This produces 9 different test structures based on the pairings, such as test structures 1-9. It is understood that other number of test structures may be produced, based on the different possible values of $W_E$, $L_E$ and P that comply with the above rules.

In one embodiment, the resistance of different test structures with different surrounding empty regions and filled regions with different dummy pattern density can be quickly tested. For example, a normal (or designed) resistance value indicates a healthy M1 and CA connection without any barrier oxidation, and a high resistance indicates barrier oxidation at the M1 and CA interface.

In one embodiment, a design window for forming interconnects with reduced barrier oxidation can be defined without process change. For example, the test structures can be monitored to determine a selected pattern density based on a given process. As such, a reticle can be designed with the selected pattern density based on the design window. This results in improved yields without process changes. Additionally, the test structures can facilitate in determining process parameters to achieve improved barrier integrity, interface properties and etch plasma density. By being able to determine the process window, barrier oxidation can be reduced, improving yields.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a wafer, the wafer comprises a device layer having a main device region and a perimeter region;
patterning the device layer with active and test patterns, wherein the test pattern comprises dummy patterns disposed in a test device area;
processing the wafer, wherein the process forms
at least one test device disposed in the perimeter region, wherein the test device comprises a resistor which includes a resistive element with first and second resistor ends,
and one or more active devices disposed in the main device region, wherein the test device determines a design window of the one or more active devices; and
performing additional processing to complete forming the device.

2. The method of claim 1 wherein forming the at least one test device comprises:
forming the resistor disposed on a substrate;
forming an interlayer dielectric (ILD) layer on the substrate, wherein the ILD layer comprises upper and lower ILD layers, an etch stop layer is disposed between the upper and lower ILD layers; and
forming first and second resistor terminals disposed on the ILD layer, wherein the first and second resistor terminals are in communication with the first and second resistor ends.

3. The method of claim 2 wherein:
the resistive element comprises an electrical resistance disposed between the first and second resistor terminals; and
the resistance is a designed resistance ($R_D$).

4. The method of claim 3 wherein the resistor comprises a polysilicon resistive element.

5. The method of claim 2 wherein:
the lower interlayer dielectric (ILD) layer comprises a tetraethyl orthosilicate (TEOS) layer over a high aspect ratio process (HARP) dielectric layer; and
the upper ILD layer comprises a low k dielectric layer.

6. The method of claim 5 wherein each of the resistor terminals comprises:
a lower resistor terminal, wherein
forming the lower resistor terminal includes forming a via opening in the lower interlayer dielectric (ILD) layer, and
forming a contact disposed in the via opening; and an upper resistor terminal, wherein
forming the upper resistor terminal includes forming a trench in the upper ILD layer,
forming a barrier layer, wherein the barrier layer lines the trench without filling the trench, and
forming a metal pad disposed in the trench, wherein the metal pad fills the trench.

7. The method of claim 6 wherein the barrier layer comprises a combination of conductive materials.

8. The method of claim 7 wherein the barrier layer comprises tantalum nitride (TaN) and tantalum (Ta).

9. The method of claim 6 wherein the lower resistor terminal comprises tungsten and the upper resistor terminal comprises copper.

10. The method of claim 1 wherein:
the test device area comprises first, second and third regions;
the second region surrounds the first region; and
the third region surrounds the second region and defines the dimension of the test device area.

11. The method of claim 10 wherein:
the first region comprises resistor terminals in communication with a resistive element;
the second region comprises an empty region devoid of dummy structures; and
the third region comprises a filled region filled with dummy structures.

12. The method of claim 11 wherein:
the empty region comprises a designed size; and
the filled region comprises a designed dummy density.

13. The method of claim 12 wherein a pairing of the empty region and filled region defines the design window.

14. A method of forming a device comprising:
providing a substrate with a device layer;
forming a resist layer on the device layer;
providing a patterned reticle comprising active and test patterns corresponding to active and test devices, the test device determines a design window of the active device, wherein
the active patterns are disposed in a device region and the test patterns are disposed in a frame region, the frame region surrounds the device region,
the test patterns comprise a filled region filled with dummy structures,
the filled region surrounds an empty region devoid of dummy structures, and
the empty region surrounds an innermost region comprising a resistor, the resistor comprises a resistive element with first and second resistor ends;
patterning the resist layer using the reticle to form a patterned resist layer containing active and test patterns of the reticle;
performing an etch to pattern the device layer using the patterned resist layer; and
performing additional processing to complete forming the device.

15. The method of claim 14 comprising:
forming an interlayer dielectric (ILD) layer on the substrate, wherein the ILD layer comprises upper and lower ILD layers, an etch stop layer is disposed between the upper and lower ILD layers; and
forming first and second resistor terminals disposed on the ILD layer, wherein the first and second resistor terminals are in communication with the first and second resistor ends.

16. The method of claim 15 wherein each of the resistor terminals comprises:
a lower resistor terminal, wherein
forming the lower resistor terminal includes forming a via opening in the lower interlayer dielectric (ILD) layer, and
forming a contact disposed in the via opening; and
an upper resistor terminal, wherein
forming the upper resistor terminal includes forming a trench in the upper ILD layer,
forming a barrier layer, wherein the barrier layer lines the trench without filling the trench, and
forming a metal pad disposed in the trench, wherein the metal pad fills the trench.

17. The method of claim 16 wherein:
the barrier layer comprises a combination of conductive materials; and
the combination of conductive materials comprise tantalum nitride (TaN) and tantalum (Ta).

18. The method of claim 16 wherein:
the resistive element comprises an electrical resistance disposed between the first and second resistor terminals; and
the resistance is a designed resistance ($R_D$).

19. The method of claim 18 comprising:
testing the designed resistance ($R_D$) of the resistor to monitor barrier layer oxidation.

20. The method of claim 14 wherein:
the empty region comprises a designed size;
the filled region comprises a designed dummy density; and
a pairing of the empty region and filled region defines the design window.

21. A device comprising:
a wafer having active patterns disposed on a wafer substrate, wherein the active patterns are defined by a design window, the design window is determined by a test structure, wherein
the test structure comprises a filled region filled with dummy structures,
the filled region surrounds an empty region devoid of dummy structures,
the empty region surrounds an innermost region comprising a resistor having a designed resistance, and
a pairing of the empty region and filled region determines the design window.

* * * * *